United States Patent [19]

Taki

[11] Patent Number: 4,740,719
[45] Date of Patent: Apr. 26, 1988

[54] SEMICONDUCTOR INTEGRATED CIRCUIT DEVICE

[75] Inventor: Youichirou Taki, Itami, Japan

[73] Assignee: Mitsubishi Denki Kabushiki Kaisha, Tokyo, Japan

[21] Appl. No.: 928,001

[22] Filed: Nov. 7, 1986

[30] Foreign Application Priority Data

Nov. 7, 1985 [JP] Japan .................. 60-249583

[51] Int. Cl.⁴ .................. H03K 19/20; H03K 3/33; H03K 17/16; H03K 3/01
[52] U.S. Cl. .................. 307/456; 307/300; 307/443; 307/270; 307/458; 307/457
[58] Field of Search .............. 307/456, 443, 454, 270, 307/457, 458, 460, 446, 300

[56] References Cited

U.S. PATENT DOCUMENTS

| 3,557,383 | 10/1967 | Wavre et al. | 307/442 |
| 3,792,292 | 2/1974 | Priel | 307/473 |
| 3,867,644 | 2/1975 | Cline | 307/456 |
| 4,234,805 | 11/1980 | Carlsen, II | 307/254 |
| 4,255,670 | 3/1981 | Griffith | 307/454 |
| 4,321,490 | 3/1982 | Bechdolt | 307/456 |
| 4,591,741 | 5/1986 | Cooper | 307/456 |

FOREIGN PATENT DOCUMENTS 3231095 5/1985 Fed. Rep. of Germany .
2099252 3/1982 United Kingdom .

OTHER PUBLICATIONS

Mitsubishi Semiconductors 1985 Bipolar Digital IC ALSTTL, Mitsubishi, Printed in Japan, Apr. 1985, pp. 2–15.

Primary Examiner—Stanley D. Miller
Assistant Examiner—Trong Quang Phan
Attorney, Agent, or Firm—Birch, Stewart, Kolasch & Birch

[57] ABSTRACT

A semiconductor integrated circuit device including: a first transistor whose base receives an input signal, and whose collector is connected to a high power supply voltage; a second transistor whose base is conducted to the emitter of said first transistor and whose emitter is connected to a low power supply voltage; a third transistor whose base is connected to the collector of said first transistor, whose collector is connected to said high power supply voltage, and whose emitter is connected to the collector of said second transistor directly or via a load element; and a fourth transistor whose base is connected to the emitter of said third transistor, whose emitter is connected to said low power supply voltage, and from whose collector an output signal of said semiconductor integrated circuit device is taken out.

1 Claim, 2 Drawing Sheets

SEMICONDUCTOR INTEGRATED CIRCUIT DEVICE

FIELD OF THE INVENTION

The present invention relates to a semiconductor integrated circuit device, and more particularly to an output circuit of such as an ALSTTL (Advance Low Power Schottky Transistor-Transistor Logic).

BACKGROUND ART

Conventionally, as an output circuit of such an ALSTTL, there is one which is shown in page 15 of MITSUBISHI SEMICONDUCTORS DATA BOOK BIPOLAR DIGITAL IC <ALSTTL> of 1984.

FIG. 2 shows an output equivalent circuit of such an ALSTTL recited in this article. In FIG. 2, the reference numeral 1 designates a high voltage power supply terminal, the reference numeral 2 designates a low voltage power supply terminal, and the reference numeral 3 designates an output terminal. The reference numeral 4 designates a first transistor comprising a Schottky clamped npn transistor (hereinafter referred to as "SBDnpnTr") whose base receives an input signal and whose collector is connected to the high voltage power supply terminal 1 via a resistor 13. The reference numeral 6 designates a third transistor comprising a SBDnpnTr whose base is connected to the collector of the first transistor 4 and whose collector is connected to the high voltage power supply terminal 1 via a resistor 14. The reference numeral 7 designates a fourth transistor comprising a SBDnpnTr whose base is connected to the emitter of the third transistor 6, whose emitter is connected to the low voltage power supply terminal 2, and whose collector is connected to the output terminal 3. The reference numeral 8 designates a fifth transistor comprising a SBDnpnTr whose base is connected to the collector of the third transistor 6 and whose collector is connected to the high voltage power supply terminal 1 via a resistor 15. The reference numeral 9 designates a sixth transistor whose base is connected to the emitter of the fifth transistor 8, whose collector is connected to the collector of the fifth transistor 8, and whose emitter is connected to the output terminal 3.

The reference numeral 10 designates a pn diode whose anode is connected to the emitter of the first transistor 4, and whose cathode is connected to the low voltage power supply terminal 2. The reference numeral 11 designates a Schottky barrier diode whose anode is connected to the output terminal 3 and whose cathode is connected to the collector of the third transistor 6. The reference numeral 16 designates a resistor which is connected between the base and the emitter of the npn transistor 9. The reference numeral 19 designates a seventh transistor comprising a SBDnpnTr whose base is connected to the base of the fourth transistor 7 via a resistor 17, and whose collector is connected to the base of the fourth transistor 7 via a resistor 18.

The circuit will be operated as follows.

First of all, when a signal of high level is input to the base of the first transistor 4, the first transistor 4 and the pn diode 10 are turned ON, and as a result the third transistor 6 is turned OFF, and the seventh transistor 19 is transiently turned ON thereby to subtract the base charges of the fourth transistor 7. The fourth transistor 7 is thus turned OFF. Furthermore, the third transistor 6 is turned OFF, and the fifth and sixth transistors 8 and 9 are turned ON, and a current flows from the high voltage power supply terminal 1 to the output terminal 3 through the resistor 15, and the voltage of the output terminal 3 becomes high level.

On the other hand, when a signal of low level is input to the base of the first transistor 4, the first transistor 4 and the pn diode 10 are turned OFF, and as a result the third and the fourth transistors 6 and 7 are turned ON, and a current is absorbed from the output terminal 3, whereby the voltage of the output terminal 3 becomes low level. Then, the third transistor 6 is turned ON, and the fifth and sixth transistors 8 and 9 are turned OFF.

Herein, the first transistor 4 is turned ON when the signal applied to the base thereof is higher than the sum of the anode cathode voltage $V_{F10}$ of the pn diode 10 and the base emitter voltage $V_{BE4}$ of the first transistor 4, and it is turned OFF when it is lower than that.

By the way, in this circuit with such a construction when the third transistor 6 is turned OFF, the seventh transistor 19 is transiently turned ON, and the fourth transistor 7 is turned OFF. However, the time period while the seventh transistor 19 is turned ON from the OFF state is short, and the current value which flows through this transistor 19 is restricted by the resistor 18 even during the turned ON state, thereby resulting in a long transfer time of transferring the low or high level of the output which is a switching time of the circuit.

SUMMARY OF THE INVENTION

An object of the present invention is to provide an improved semiconductor integrated circuit device capable of shortening an output transfer time which is a switching time of the circuit.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor integrated circuit device comprising: a first transistor whose base receives an input signal, and whose collector is connected to a high power supply voltage; a second transistor whose base is connected to the emitter of said first transistor and whose emitter is connected to a low power supply voltage; a third transistor whose base is connected to the collector of said first transistor, whose collector is connected to said high power supply voltage, and whose emitter is connected to the collector of said second transistor directly or via a load element; and a fourth transistor whose base is connected to the emitter of said third transistor, whose emitter is connected to said low power supply voltage, and from whose collector an output signal of said semiconductor integrated circuit device is taken out.

DETAILED DESCRIPTION OF THE PREFERRED EMBODIMENTS

Figure 1:
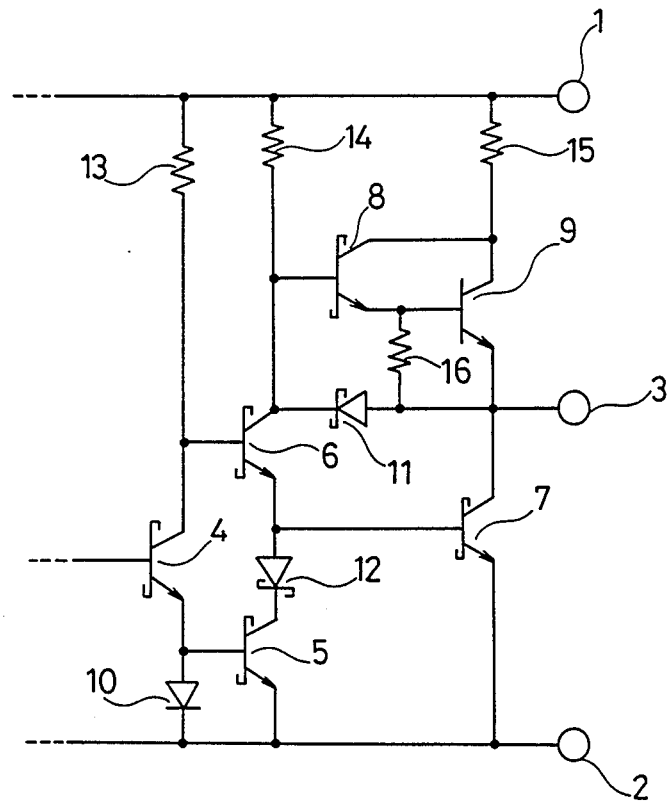
FIG. 1 is a circuit diagram showing a semiconductor integrated circuit device as an embodiment of the present invention.

In order to explain the present invention in detail, reference will be particularly made to FIG. 1.

Figure 2:
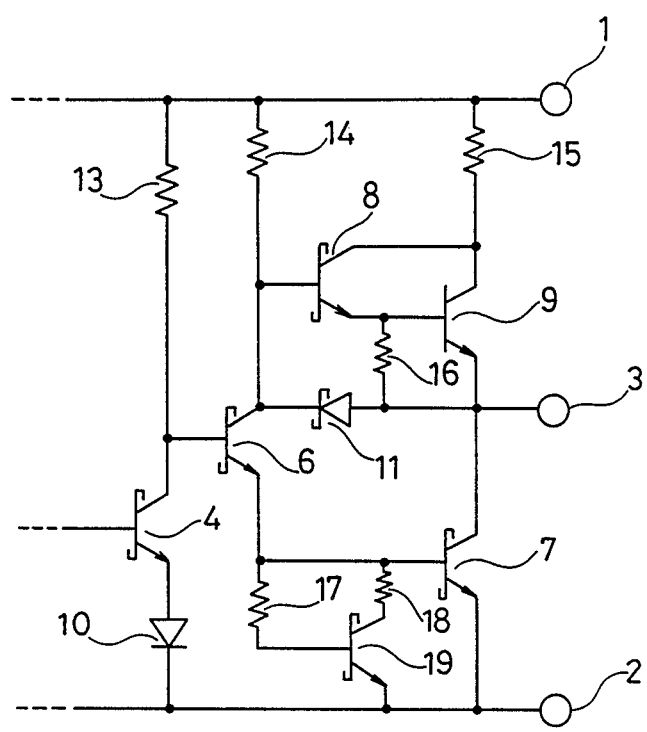
FIG. 2 is a circuit diagram showing the output circuit of the conventional ALSTTL.

FIG. 1 shows a semiconductor integrated circuit device as an embodiment of the present invention. In FIG. 1 the same reference numerals as those shown in FIG. 2 designate the same elements. The reference numeral 5 designates a second transistor comprising a SBDnpnTr whose base is connected to the emitter of the first transistor 4, and whose emitter is connected to the low voltage power supply terminal 2. The reference numeral 12 designates a Schottky barrier diode whose anode is connected to the base of the fourth transistor 7 and whose cathode is connected to the collector of the second transistor 5.

The device will be operated as follows.

First of all, when a signal of high level is input to the base of the first transistor 4, the first transistor 4 is turned ON. As a result the second transistor 5 is turned ON, and base charges of the fourth transistor 7 are absorbed through the first Schottky barrier diode 12. The fourth transistor 7 is thus turned OFF. On the other hand, when the first transistor 4 is turned ON and the third transistor 6 is turned OFF, the fifth and sixth transistors 8 and 9 are turned ON, and a current flows from the high voltage power supply terminal 1 to the output terminal 3 through the resistor 15, and the voltage of the output terminal 3 becomes a high level.

In this embodiment the base charges of the fourth transistor 7 are absorbed by the turning ON of the first transistor 4 which leads the turning ON of the second transistor 5, and the timing when the fourth transistor 7 is turned OFF is made close to the timing when the third transistor 6 is turned OFF.

Next, when a signal of low level is input to the base of the first transistor 4, the first transistor 4 and the pn diode 10 are both turned OFF, and as a result the second transistor 5 is turned OFF. On the other hand, the third and fourth transistors 6 and 7 are turned ON at the same time when the first transistor 4 is turned OFF, whereby a current is absorbed from the output terminal 3, and the voltage of the output terminal 3 becomes low level. Then, the third transistor 6 is turned ON, and the fifth and sixth transistors 8 and 9 are turned OFF.

The first transistor 4 is turned ON when the signal input to the base thereof is larger than the sum of the anode cathode voltage $V_{F10}$ of the pn diode 10 and the base emitter voltage $V_{BE4}$ of the first transistor 4, and it is turned OFF when it is lower than that.

As is evident from the foregoing description, according to the present invention, base charges of a fourth transistor are absorbed as a collector current of a second transistor whose base is connected to the emitter of a first transistor, the timing when a third transistor is turned OFF is made close to a timing when a fourth transistor is turned OFF, and a device is obtained which has a short transfer time of transferring the low or high level of the output which is a switching time of the circuit.

What is claimed is:

1. A semiconductor integrated circuit device comprising:
    a first transistor whose base receives an input signal, and whose collector is connected to a high power supply voltage;
    a second transistor whose base is connected to the emitter of said first transistor and whose emitter is connected to a low power supply voltage;
    a third transistor whose base is connected to the collector of said first transistor, whose collector is connected to said high power supply voltage, and whose emitter is operatively connected to the collector of said second transistor;
    a fourth transistor whose base is connected to the emitter of said third transistor, whose emitter is connected to said low power supply voltage, and from whose collector an output signal of said semiconductor integrated circuit device is taken out; and a load element forming the operative interconnection between the emitter of said third transistor and the collector of said second transistor, wherein said load element is a Schottky barrier diode whose anode is connected to the base of said fourth transistor, and whose cathode is connected to the collector of said second transistor.

* * * * *